United States Patent

Gardner et al.

[11] Patent Number: 5,998,288
[45] Date of Patent: Dec. 7, 1999

[54] ULTRA THIN SPACERS FORMED LATERALLY ADJACENT A GATE CONDUCTOR RECESSED BELOW THE UPPER SURFACE OF A SUBSTRATE

[75] Inventors: Mark I. Gardner, Cedar Creek; H. Jim Fulford, Jr., Austin, both of Tex.

[73] Assignee: Advanced Micro Devices, Inc., Sunnyvale, Calif.

[21] Appl. No.: 09/062,095

[22] Filed: Apr. 17, 1998

[51] Int. Cl.⁶ .................................................. H01L 21/3205
[52] U.S. Cl. .......................... 438/589; 438/259; 438/270; 438/275; 254/330
[58] Field of Search ...................................... 438/259, 257, 438/270, 430, 199, 275, 589, FOR 172, FOR 203, FOR 212, FOR 180, FOR 197; 257/330

[56] References Cited

U.S. PATENT DOCUMENTS

| | | | |
|---|---|---|---|
| 5,362,665 | 11/1994 | Lu | 437/52 |
| 5,429,970 | 7/1995 | Hong | 437/43 |
| 5,567,634 | 10/1996 | Hebert et al. | 437/41 |
| 5,604,367 | 2/1997 | Yang | 257/321 |
| 5,723,376 | 3/1998 | Takeuchi et al. | 438/270 |
| 5,753,554 | 5/1998 | Park | 438/296 |
| 5,756,386 | 5/1998 | Blanchard | 438/270 |
| 5,763,310 | 6/1998 | Gardner | 438/270 |
| 5,780,340 | 7/1998 | Garder et al. | 438/259 |

FOREIGN PATENT DOCUMENTS

363344683  10/1988  Japan .

*Primary Examiner*—Wael M. Fahmy
*Assistant Examiner*—Long Pham
*Attorney, Agent, or Firm*—Kevin L. Daffer; Conley, Rose & Tayon

[57] ABSTRACT

An integrated circuit fabrication process is provided for forming relatively thin sidewall spacers extending laterally from upper portions of opposed sidewall surfaces of a transistor gate conductor which resides partially within a trench of a semiconductor substrate. The present invention contemplates etching a trench through a masking layer and partially through a silicon-based substrate arranged underneath the masking layer. A gate dielectric is then formed upon silicon-based surfaces which border the trench. A conformal dielectric layer is deposited across the masking layer and the gate dielectric, followed by the deposition of a gate conductor material across the dielectric layer. The gate conductor material and the dielectric layer are removed from above the upper surface of the masking layer. Portions of the dielectric layer interposed between the masking layer and the gate conductor are etched to a level commensurate with the substrate surface. An LDD implant self-aligned to the lateral boundaries of the masking layer and the gate conductor sidewall surfaces is forwarded into the substrate underneath the trench. Relatively thin oxide spacer structures are then thermally grown upon the sidewall surfaces of the gate conductor. After removing the masking layer, a source/drain implant is performed. In another embodiment, the gate conductor is formed between the opposed lateral boundaries of the masking layer upon the gate dielectric. A source/drain implant is performed after removing the masking. Relatively thin dielectric spacers are formed upon the upper portions of the sidewall surfaces of the gate conductor by depositing and anisotropically etching a dielectric.

18 Claims, 8 Drawing Sheets

ULTRA THIN SPACERS FORMED LATERALLY ADJACENT A GATE CONDUCTOR RECESSED BELOW THE UPPER SURFACE OF A SUBSTRATE

BACKGROUND OF THE INVENTION

1. Field of the Invention

This invention relates to integrated circuit fabrication and, more particularly, to relatively thin sidewall spacers extending laterally from upper portions of opposed sidewall surfaces of a transistor gate conductor which resides partially within a trench of a semiconductor substrate.

2. Description of the Related Art

Fabrication of a MOSFET device is well known. Generally speaking, MOSFETs are manufactured by placing an undoped polycrystalline ("polysilicon") material over a relatively thin gate oxide. The polysilicon material is then patterned to form a gate conductor directly above a channel region of the substrate. A dopant species is implanted into the gate conductor and regions of the substrate exclusive of the channel region, thereby forming source and drain regions adjacent to and on opposite sides of the channel region. If the dopant species used for forming the source and drain regions is n-type, then the resulting MOSFET is an NMOSFET ("n-channel") transistor device. Conversely, if the dopant species is p-type, then the resulting MOSFET is a PMOSFET ("p-channel") transistor device. Integrated circuits utilize either n-channel devices exclusively, p-channel devices exclusively, or a combination of both on a single substrate. While both types of devices can be formed, the devices are distinguishable based on the dopant species used.

While in operation, transistors which have heavily doped source and drain regions arranged laterally adjacent the gate conductor often experience a problem known as hot carrier injection ("HCI"). HCI is a phenomena in which the kinetic energy of charged carriers (holes or electrons) within the channel region is increased as the carriers are accelerated through large potential gradients. As a result of this increase in kinetic energy, the charged carriers are injected into the gate oxide wherein they may become trapped. The greatest potential gradient, often referred to as the maximum electric field ("Em") occurs near the drain during saturated operation. As a result of carrier entrapment within the gate oxide, a net negative charge density forms in the gate oxide. The trapped charge can accumulate with time, resulting in a positive threshold shift in a NMOS transistor, or a negative threshold shift in a PMOS transistor.

To overcome problems of sub-threshold current and threshold shift resulting from HCI, an alternative drain structure known as the lightly doped drain ("LDD") is commonly used. The purpose of the LDD is to absorb some of the potential into the drain and thus reduce Em. A conventional LDD structure is one in which a light concentration of dopant is self-aligned to the gate conductor followed by a heavier concentration of dopant self-aligned to the gate conductor on which a pair of sidewall spacers has been formed. The purpose of the first implant dose is to produce lightly doped sections within an active area of the substrate near the channel. The second implant dose is spaced from the channel by a distance substantially equivalent to the thickness of each sidewall spacer. The second implant dose forms heavily doped source and drain regions within the active area laterally outside the LDD areas. In this manner, the lateral thickness of each sidewall spacer dictates the length of each LDD area.

Unfortunately, the addition of LDD areas adjacent the channel adds parasitic resistance to the source-drain pathway, leading to many deleterious effects. For example, the parasitic resistance causes an increase in the value of the gate-to-source voltage, $V_{GS}$, required for the drive current, $I_D$, (i.e., current flowing between the source and drain regions of a transistor in its on-state) to reach saturation. Therefore, in order to reduce the parasitic resistance of the source-drain pathway, it has become necessary to reduce the lateral dimensions of the LDD areas. However, the length of each LDD area cannot be reduced below a specific dimension using conventional methods. In particular, the lateral thickness of the sidewall spacers used to define LDD areas generally has a limited minimum size. The sidewall spacers are typically formed by chemically-vapor depositing a layer of spacer material across the substrate and the gate conductor arranged above the substrate. The spacer material is thusly placed upon the opposed sidewall surfaces of the gate conductor, the upper surface of the gate conductor, and the upper surface of the substrate exterior to the gate conductor. The spacer material is then anisotropically etched such that it is removed from horizontally oriented surfaces faster than from vertically oriented surfaces. The duration of the anisotropic etch is preferably terminated after the spacer material has been removed from a significant portion of the horizontally oriented surfaces but before the spacer material can be completely removed from the vertically extending sidewall surfaces.

Although chemical-vapor deposition ("CVD") is not as vertically-directed as physical vapor deposition, a CVD deposited material still tends to accumulate more quickly upon horizontally oriented surfaces than upon vertically oriented surfaces. The accumulation of the CVD deposited material is particularly poor upon tall vertical surfaces. The thickness of a gate conductor, and hence the height of the sidewall surfaces which bound the gate conductor, must be maintained above, e.g., 200 Å, to ensure that the conductivity of the gate conductor is relatively high. While increasing the width of the gate conductor would also afford good conductivity of the gate conductor, it would undesirably lead to an increase in the threshold voltage, $V_T$, of the transistor employing the gate conductor. Accordingly, in order to achieve good coverage of the vertically oriented sidewall surfaces of the gate conductor, an adequate amount of spacer material must be deposited across the gate conductor. Reducing the lateral thickness of the sidewall spacers thus cannot be achieved by decreasing the deposition time, and hence the thickness, of the spacer material. Moreover, the lateral thickness of the sidewall spacers cannot be reduced by increasing the anisotropic etch duration of the spacer material. That is, if the anisotropic etch is allowed to proceed too long, the gate conductor and the substrate will be over-etched, undesirably resulting in a significant decrease in the thicknesses of the gate conductor and the pre-existing LDD region within the substrate. In addition to preventing the reduction of the width of the LDD areas, this inability to reduce the lateral thickness of the spacers also limits the amount of packing density that can be achieved for an integrated circuit.

The dimensions of transistor features have become increasingly smaller to provide for faster, more complex integrated circuit devices. Unfortunately, the shrinkage of device dimensions has given rise to various problems. The distance between the source and drain regions of a transistor is often referred to as the physical channel length. However, after implantation of dopant species into the source and drain regions and subsequent diffusion of the dopant species, the actual distance between the source and drain regions becomes less than the physical channel length and is often referred to as the effective channel length ("Leff"). In VLSI designs, as the physical channel length becomes small, so too must the Leff. Decreasing the Leff of a transistor generally leads to so-called short-channel effects ("SCE") in which the transistor's properties, e.g., the transistor threshold voltage, undesirably vary from their design specification. Absent a comparable reduction in the depth of the source and drain junctions, the severity of the SCE resulting from a decrease in Leff may be profound. Accordingly, it has become necessary to scale down the vertical dimensions of the source and drain regions, (i.e., the depth of the source/drain implant), to ensure proper operation of transistor devices.

The formation of shallow source and drain regions (i.e., junctions) is, however, rather difficult for PMOSFET devices which include boron-implanted junctions. Due to the relatively high diffusivity and channeling of boron atoms, implanted boron can penetrate deeply into the substrate. While using very low implant energies of boron might produce relatively shallow junctions, advances in technology are required to make available low-energy ion implanters before such low implant energies can be realized. Further, while reducing the junction depth provides protection against SCE, it also gives rise to increased resistivity of the source and drain junctions, adversely impacting the device operation. As a result of the increased resistivity, the saturation drive current and the overall speed of the transistor may drop. Moreover, forming contacts to relatively shallow junctions has several drawbacks. A contact layer which consumes the underlying source and drain junctions is often used during contact formation. For example, a refractory metal may be deposited across the source and drain junctions and heated to promote a reaction between the metal and the underlying silicon, thereby forming a low resistivity self-aligned silicide (i.e., salicide) upon the junctions. The silicide may completely consume the shallow junctions, penetrating into the substrate underneath the junctions, a phenomenon known as "junction spiking", Consequently, the junctions may exhibit large current leakage or become electrically shorted. Therefore, precautions must be taken to prevent excessive consumption, and hence junction spiking, of the shallow junctions during contact formation.

It would therefore be of benefit to develop a technique for forming a transistor having LDD areas of relatively small width to afford a low resistance pathway between the source and drain junctions of the transistor. As such, the lateral thicknesses of sidewall spacers which dictate the lateral dimensions of the LDD areas must be reduced. Furthermore, the transistor design should call for relatively shallow "effective" source and drain junctions without being concerned that the resistivity of the junctions will be increased. Accordingly, the transistor design must account for reductions in the Leff of the transistor by providing protection against short channel effects. While reducing the effective depth of the source and drain junctions would be desirable, the actual depth of the junctions must be sufficiently large to avoid problems associated with junction spiking and excessive junction consumption.

SUMMARY OF THE INVENTION

The problems outlined above are in large part solved by the technique hereof for forming a transistor having sidewall spacers (or structures) of relatively small lateral width extending laterally from upper portions of the opposed sidewall surfaces of a gate conductor. The gate conductor, being formed within a trench, is partially recessed below the uppermost surface of a single crystalline semiconductor substrate. The sidewall spacers advantageously occupy little lateral area within an integrated circuit, and thus provide for high integration density within the circuit. The gate conductor combined with the sidewall spacers formed on opposite sides of the gate conductor serve as a mask during the implantation of dopant species into source and drain regions of the substrate. The dopant species are implanted to a depth spaced below the base of the trench within which the gate conductor is formed. The resulting doped source and drain regions have a relatively shallow "effective" depth extending below the base of the trench. The reduced effective depth of the source and drain regions permits the Leff of the transistor to be scaled down without experiencing severe and detrimental short channel effects. Further, the actual depth of the source and drain regions is sufficiently large to substantially prevent junction spiking during the subsequent formation of silicide contact areas upon the source and drain regions. The source and drain regions also exhibit low resistance, and thus provide for adequate drive current, $I_D$, between the source and drain regions during operation of the transistor.

The present invention contemplates etching entirely through a masking layer formed upon a silicon-based substrate and partially through the substrate to form a trench within the substrate. A plasma etch technique is preferably employed to ensure that the lateral boundaries of the masking layer and the sidewalls of the trench are substantially vertical. A gate dielectric is formed upon the sidewalls and the base of the trench. The gate dielectric may, e.g., comprise thermally grown silicon dioxide ("oxide"). The masking layer is preferably a material through which ambient oxygen cannot significantly migrate. For example, the masking layer may comprises silicon nitride ("nitride") arranged upon a pad oxide layer. The presence of such a masking layer upon the horizontal uppermost surface of the substrate substantially inhibits the underlying silicon-based surface from being oxidized during the formation of the gate dielectric.

According to one embodiment, a dielectric layer, e.g., oxide, may be deposited by chemical-vapor deposition ("CVD") across the masking layer and the gate dielectric such that a pair of dielectric sidewall spacers are formed laterally adjacent opposed lateral boundaries of the masking layer. The duration of the deposition may be varied to control the thickness of the dielectric layer, and hence the lateral thickness of the sidewall spacers formed from the dielectric layer. Subsequently, a gate conductor material comprising, e.g., polysilicon, is deposited into the trench across the dielectric layer to a level spaced above the upper surface of the masking layer. Thereafter, the gate conductor material and the dielectric layer are removed from above the masking layer such that the upper surface of the gate conductor material is substantially coplanar with the upper surface of the masking layer. Removal of the gate conductor material and the dielectric layer may be accomplished using chemical-mechanical polishing ("CMP") or sacrificial etchback. The portion of the gate conductor material retained between the dielectric sidewall spacers serves as the gate conductor for an ensuing transistor.

The sidewall spacers may then be selectively etched to a level approximately commensurate with the uppermost surface of the substrate. In this manner, the opposed lateral boundaries of the masking layer and upper portions of the opposed sidewall surfaces of the gate conductor are exposed. An LDD implant which is self-aligned to those exposed lateral boundaries of the masking layer and sidewall surfaces of the gate conductor is then performed. Absent the pre-existing sidewall spacers, the LDD dopant species are permitted to pass into the substrate to form LDD areas without using a high implant energy. As such, the lateral width of each LDD area is dictated by the lateral thickness of the sidewall spacer previously arranged directly above that LDD area. Thus, the lateral width of each LDD area may be significantly reduced by decreasing the deposition time of the dielectric sidewall spacers (i.e., the dielectric layer). Reducing the lateral width of the LDD areas affords lower resistance to the flow of current (i.e., drive current) between the source and drain junctions of the ensuing transistor. Forming the gate conductor partially recessed below the uppermost surface of the substrate results in the masking layer height being less than that of the gate conductor. The dielectric layer may thus be conformally deposited across the relatively short lateral boundaries of the masking layer to form sidewall spacers of substantially uniform lateral thickness. The lateral edges of the sidewall spacers are thus parallel to the vertically rising lateral boundaries of the masking layer. As such, the opposed sidewall surfaces of the gate conductor which are formed against the lateral edges of the sidewall spacers are also substantially vertical. The vertical orientation of the boundaries of the masking layer and the sidewall surfaces of the gate conductor allows the size of the LDD areas to be dictated primarily by the thickness of the sidewall spacers interposed therebetween.

Subsequent to performing the LDD implant, the masking layer is removed from the substrate surface. A dielectric, e.g., oxide, nitride, or silicon oxynitride, is then thermally grown upon the upper surface and opposed sidewall surfaces of the gate conductor. Those portions of the dielectric extending laterally from the opposed sidewall surfaces of the gate conductor form sidewall structures laterally adjacent the gate conductor. Thermally growing the dielectric permits relatively thin sidewall spacers to be formed absent concerns that the gate conductor sidewalls might not be adequately covered. A source/drain implant which is self-aligned to exposed lateral edges of the sidewall structures is forwarded into the substrate to a depth spaced below the base of the trench to form source and drain regions laterally adjacent the LDD areas. The dielectric residing upon the upper surface of the gate conductor may then be removed using, e.g., an anisotropic etch. Self-aligned metal silicide (i.e., salicide) structures may be formed upon the source and drain regions and the upper surface of the gate conductor by heating a refractory metal deposited across the topography, thereby causing silicon to react with the metal. The presence of the dielectric sidewall structures prevents the refractory metal from contacting and reacting with the polysilicon sidewall surfaces of the gate conductor. Thus, silicide shorting between the gate conductor and the source and drain regions is less likely to occur.

In an alternate embodiment, the gate conductor material is deposited across the masking layer and the gate dielectric arranged at the periphery of the trench to a level spaced above the upper surface of the masking layer. No interposing dielectric layer is formed between the masking layer and the gate conductor material. The gate conductor material is then removed to a level approximately commensurate with the upper surface of the masking layer to form a gate conductor partially recessed below the horizontal uppermost surface of the substrate. An oxide layer may be thermally grown across the upper surface of the gate conductor to provide an additional masking material above the substrate during subsequent implantation of dopant species. The masking layer is then etched from above the substrate to expose upper portions of the opposed sidewall surfaces of the gate conductor. A source/drain implant which is self-aligned to the opposed sidewall surfaces of the gate conductor is then forwarded into the substrate to form source and drain regions immediately adjacent the trench sidewalls. The dopant species implanted into the source and drain regions are then annealed using, e.g., a rapid thermal anneal ("RTA") process such that the dopant species migrate laterally. The dopant species do not diffuse far since RTA only exposes the species to a heat cycle for a short period of time. In this manner, LDD areas having relatively short lateral widths are formed beneath the edges of the trench.

Thereafter, a dielectric spacer material is CVD deposited across the topography and anisotropically etched to form dielectric sidewall spacers upon the upper portions of the opposed sidewall surfaces of the gate conductor. Anisotropic etch affords ion ablation of the dielectric spacer material more rapidly in a vertical direction than in a horizontal direction. As such, the spacer material, the oxide layer residing upon the upper surface of the gate conductor, and the pad oxide layer may be removed from horizontally oriented surfaces while retaining the spacer material laterally adjacent the sidewall surfaces of the gate conductor. The deposition of the spacer material is relatively conformal upon the shorter upper portions of the sidewall surfaces of the gate conductor. As such, the deposition duration of the spacer material may be reduced without risking a loss of the uniformity of the spacer thickness. Therefore, sidewall spacers with smaller lateral thicknesses may be formed which adequately cover the opposed sidewall surfaces of the gate conductor. Low resistivity salicide structures may thus be formed upon the source and drain regions and the upper surface of the gate conductor without concerns that the silicide might from a conductive path between the gate conductor and the source and drain regions. That is, the dielectric spacers inhibit the formation of silicide laterally adjacent the sidewall surfaces of the gate conductor.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
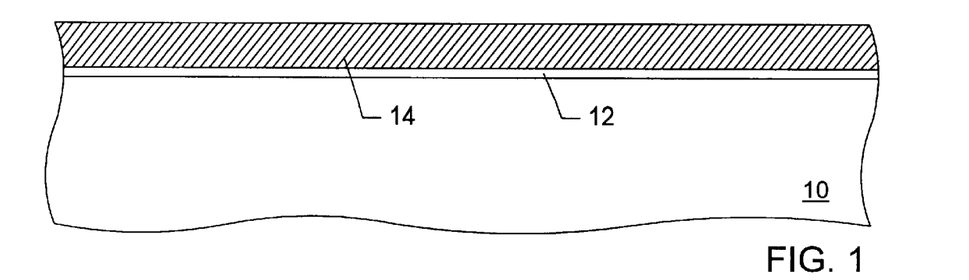
FIG. 1 depicts a partial cross-sectional view of a semiconductor topography according to an embodiment of the present invention, wherein a nitride layer and a pad oxide layer are formed across a silicon-based substrate to create a masking layer.

FIGS. 1–14 illustrate a sequence of semiconductor fabrication steps according to one embodiment of the present invention. Turning to FIG. 1, a partial cross-sectional view of a semiconductor substrate 10 is depicted. Substrate 10 preferably comprises single crystalline silicon which has been slightly doped with n-type or p-type impurities.

Although not shown, dielectric isolation regions (i.e., field regions) may be arranged spaced distances apart within substrate 10 for dielectrically isolating ensuing active areas. In an alternate embodiment, p-type and n-type wells may be arranged within select regions of substrate 10 to allow for the formation of a CMOS integrated circuit which includes both NMOSFET and PMOSFET transistors. A pad oxide layer 12 is formed across semiconductor substrate 10 using, e.g., LPCVD from a TEOS (tetraethyl orthosilicate) source. A nitride layer 14 is then LPCVD deposited across pad oxide layer 12 from, e.g., a silane- and ammonia-bearing source. Pad oxide layer 12 serves to reduce the inherent stresses which normally exist between nitride and silicon. Nitride layer 14 in combination with pad oxide layer 12 may serve as a masking layer during subsequent ion processing steps.

Figure 2:
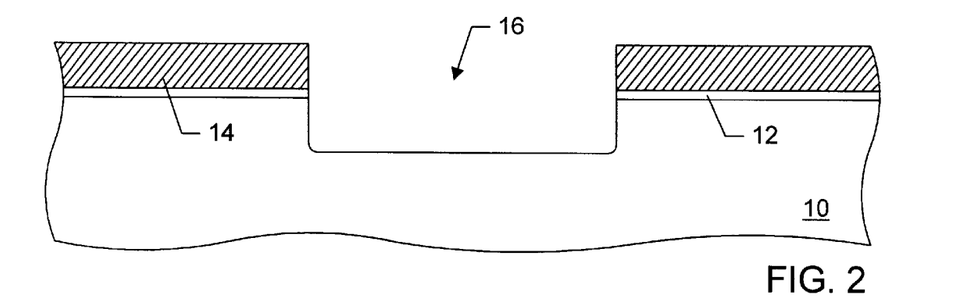
FIG. 2 depicts a partial cross-sectional view of the semiconductor topography, wherein portions of the nitride layer, the oxide layer, and the substrate are etched away to form a trench extending below the uppermost surface of the substrate, subsequent to the step in FIG. 1.
Figure 3:
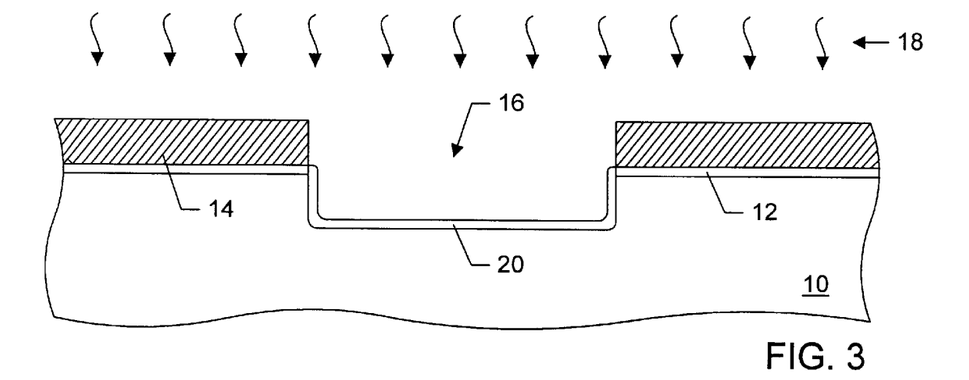
FIG. 3 depicts a partial cross-sectional view of the semiconductor topography, wherein a gate dielectric is thermally grown upon the silicon-based surfaces bordering the trench, subsequent to the step in FIG. 2.

As shown in FIG. 2, portions of nitride layer 14, pad oxide layer 12, and substrate 10 are then etched to form a trench 16 within substrate 10. Lithography is used to pattern a photoresist mask across nitride layer 14 exclusive of the region to be etched. The etch technique is preferably a dry, plasma etch in which the etch duration is selected to terminate after a pre-defined thickness of the substrate has been removed. The depth of trench 16 relative to the horizontal uppermost surface of substrate 10 may be, e.g., 0.1 to 0.5 micron. Opposed sidewalls of trench 16 are aligned with opposed lateral boundaries of nitride layer 14. FIG. 3 illustrates a gate dielectric 20 being formed upon the silicon-based surfaces arranged about the perimeter of trench 16. Those silicon-based surfaces may be oxidized by subjecting substrate 10 to thermal radiation 18 and an oxygen-bearing ambient. While gate dielectric 20 is preferably a thermally grown oxide, it may also be other dielectric materials. For example, high frequency operation of the ensuing transistor may be achieved if gate dielectric 20 comprises a dielectric having a dielectric constant greater than that of oxide, e.g., nitride. Nitride layer 14 substantially inhibits ambient oxygen from penetrating to and oxidizing underlying regions of substrate 10. As such, nitride layer 14 may be substituted with any material which can act as an oxygen barrier.

Figure 4:
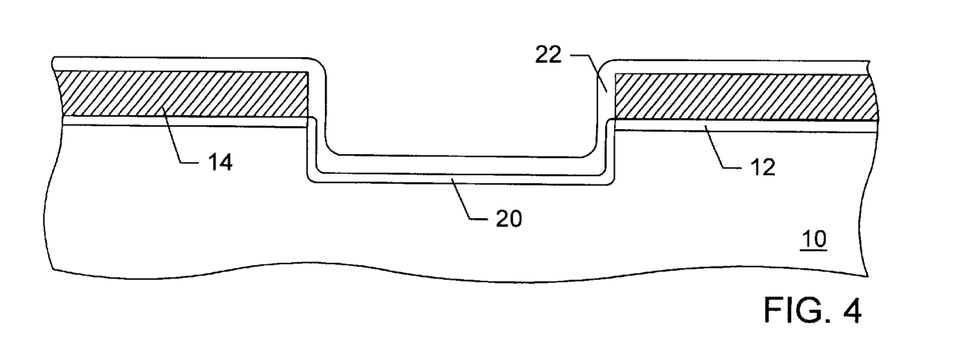
FIG. 4 depicts a partial cross-sectional view of the semiconductor topography, wherein a substantially conformal dielectric layer is deposited across exposed surfaces of the masking layer and the gate dielectric to form dielectric sidewall spacers laterally adjacent the lateral boundaries of the masking layer, subsequent to the step in FIG. 3.
Figure 5:
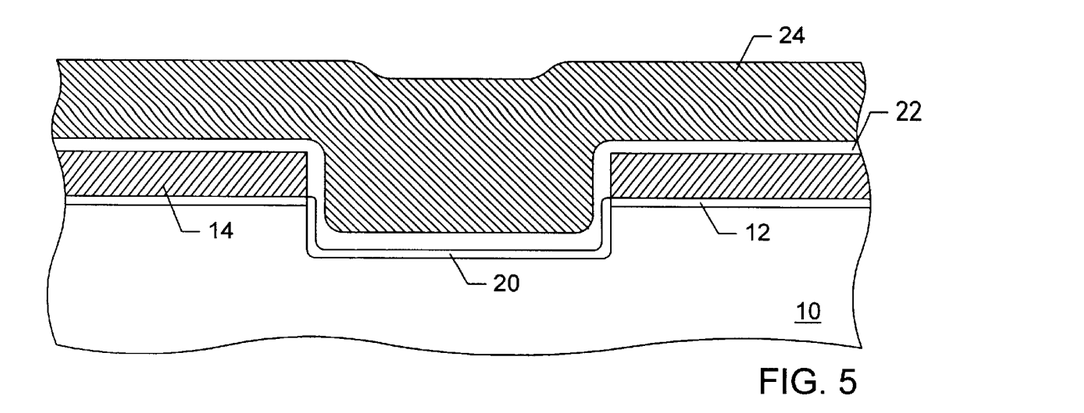
FIG. 5 depicts a partial cross-sectional view of the semiconductor topography, wherein a gate conductor material is deposited across the dielectric layer to a level spaced above the upper surface of the masking layer, subsequent to the step in FIG. 4.
Figure 6:
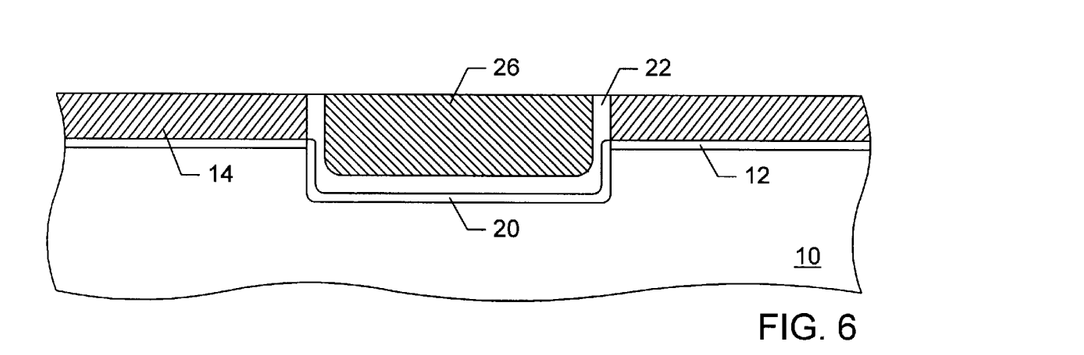
FIG. 6 depicts a partial cross-sectional view of the semiconductor topography, wherein the gate conductor material is removed down to a level approximately commensurate with the upper surface of the masking layer, subsequent to the step in FIG. 5.

FIG. 4 depicts the deposition of a dielectric layer 22 across nitride layer 14 and gate dielectric 20. Dielectric layer 22 may, e.g., be LPCVD deposited from a TEOS source. Dielectric layer 22 is not limited to TEOS and may also be other dielectrics which are substantially dissimilar to nitride layer 14. The resulting dielectric layer 22 has a substantially uniform thickness of, e.g., 0.03 to 0.05 micron. As shown in FIG. 5, a gate conductor material 24 is then deposited across dielectric layer 22 to a level spaced above the upper surface of nitride layer 14. Gate conductor material 24 is preferably composed of polysilicon and thus may be PECVD deposited from, e.g., a silane source. The polysilicon may be rendered conductive by implanting impurities into the polysilicon during later processing steps. Thereafter, the upper surface of gate conductor material 24 is removed to a level approximately commensurate with the upper surface of masking layer 14, as depicted in FIG. 6. Also, dielectric layer 22 is removed from the upper surface of masking layer 14. The removal of those portions of gate conductor material 24 and dielectric 22 may be accomplished using CMP or sacrificial etchback such that the overall surface of the topography is substantially planarized. In this manner, a gate conductor 26 which is partially recessed below the uppermost surface of substrate 10 is formed between a pair of opposed sidewall surfaces. Those portions of dielectric layer 22 extending laterally between the opposed lateral boundaries of nitride layer 14 and the opposed sidewall surfaces of gate conductor 26 form sidewall spacers adjacent the upper portion of gate conductor 26.

Figure 7:
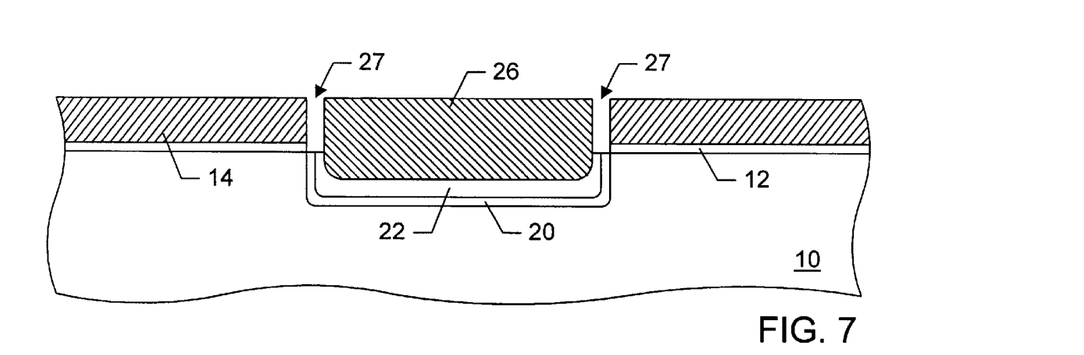
FIG. 7 depicts a partial cross-sectional view of the semiconductor topography, wherein the dielectric sidewall spacers are selectively etched to a level approximately coplanar with the uppermost surface of the substrate to expose the lateral boundaries of the masking layer and the upper portions of opposed sidewall surfaces of the gate conductor, subsequent to the step in FIG. 6.
Figure 8:
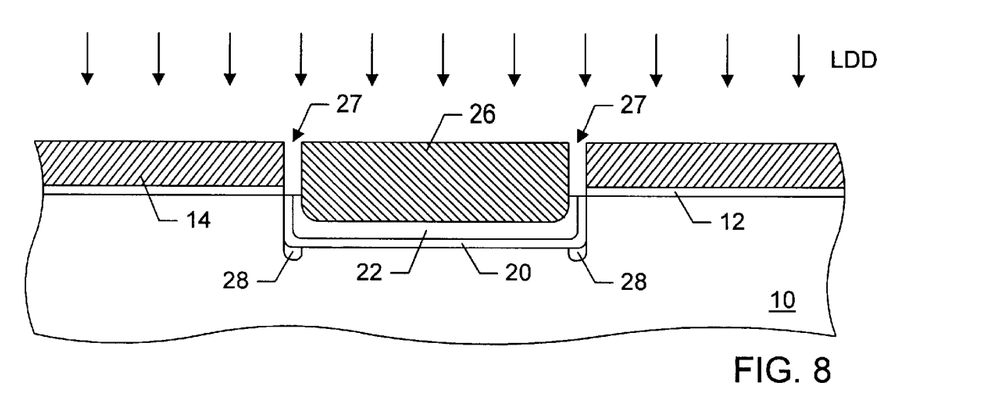
FIG. 8 depicts a partial cross-sectional view of the semiconductor topography, wherein a lightly doped drain implant that is self-aligned between the sidewall surfaces of the gate conductor and the lateral boundaries of the masking layer is forwarded into the substrate, subsequent to the step in FIG. 7.

Turning to FIG. 7, dielectric layer 22 is selectively etched to a level approximately coplanar with the uppermost surface of substrate 10. A plasma etch or a wet etch chemistry which exhibits a high selectivity for the dielectric layer material relative to the gate conductor material and to nitride may be employed to remove dielectric layer 22. A pair of openings 27 are thereby formed between nitride layer 14 and gate conductor 26 such that the lateral boundaries of nitride layer 14 and the opposed sidewall surfaces of gate conductor 26 are exposed. As shown in FIG. 8, an LDD implant is performed at a relatively low dose to implant dopant species opposite in type to those within substrate 10 into LDD areas 28. The LDD implant is self-aligned between the lateral boundaries of nitride layer 14 and the opposed sidewall surfaces of gate conductor 26. The implant energy is sufficiently large to drive the dopant species to LDD areas 28 underneath the base of the trench formed within substrate 10. However, the implant energy is not great enough to drive the dopant species entirely through nitride layer 14 and gate conductor 26 to underlying regions of substrate 10. As such, each LDD area 28 is self-aligned with, and has substantially the same lateral width as, the opening 27 positioned directly above that LDD area, and hence as the thickness of conformal dielectric layer 22.

Figure 9:
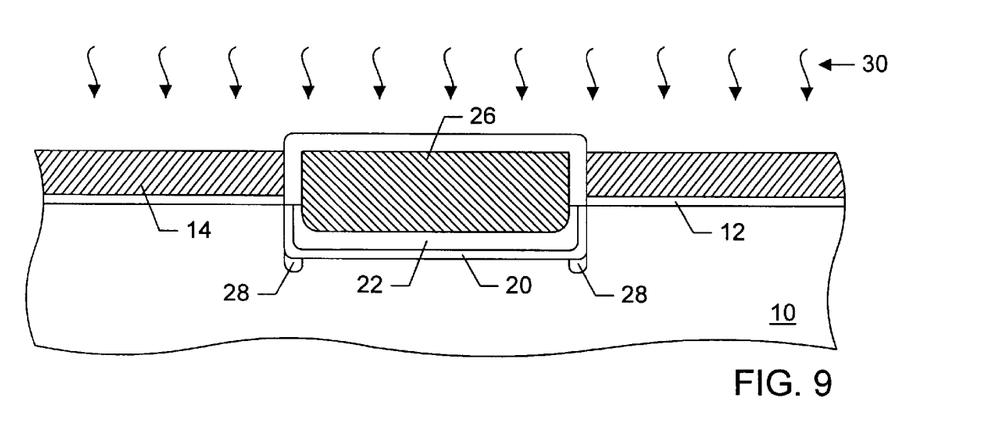
FIG. 9 depicts a partial cross-sectional view of the semiconductor topography, wherein a dielectric is thermally grown upon the opposed sidewall surfaces and the upper surface of the gate conductor such that dielectric spacer structures are placed between the masking layer and the gate conductor, subsequent to the step in FIG. 8.
Figure 10:
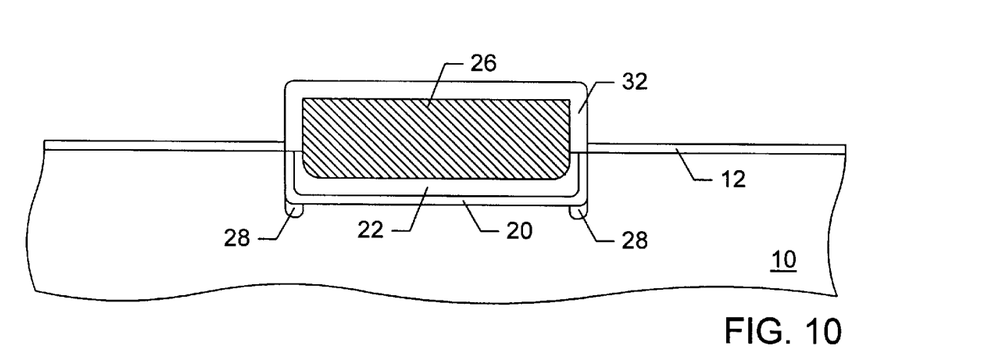
FIG. 10 depicts a partial cross-sectional view of the semiconductor topography, wherein the nitride layer is removed from the pad oxide layer, subsequent to the step in FIG. 9.

As shown in FIG. 9, an oxide layer 32 is then thermally grown upon the upper surface and the opposed sidewall surfaces of gate conductor 26. Oxide layer 32 may be formed by subjecting gate conductor 26 which is composed of polysilicon to thermal radiation 30 while in an oxygen-bearing ambient. Thermal radiation 30 may be provided from either an annealing furnace or an RTA chamber. An RTA anneal is preferred since its duration is relatively short, and results in little lateral migration of LDD areas 28. Oxide layer 32 is thermally grown for the duration required to fill openings 27. Therefore, oxide layer 32 forms oxide spacer structures interposed laterally between the opposed lateral boundaries of nitride layer 14 and upper portions of the opposed sidewall surfaces of gate conductor 26. Oxide layer 32 may be, e.g., about 0.03 to 0.05 micron thick. FIG. 10 illustrates the removal of nitride layer 14 from pad oxide layer 12. Nitride layer 14 may be etched using a plasma etch or a wet etch chemistry.

Figures 11, 12:
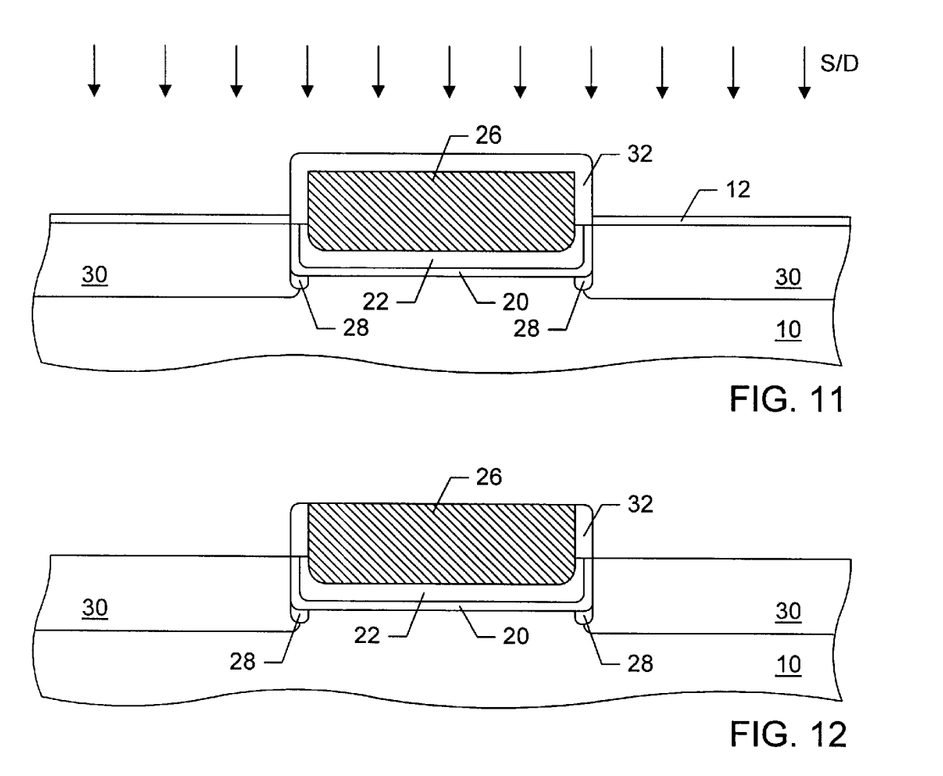
FIG. 11 depicts a partial cross-sectional view of the semiconductor topography, wherein a source/drain implant that is self-aligned to the exposed lateral surfaces of the sidewall structures is forwarded into the substrate, subsequent to the step in FIG. 10.
FIG. 12 depicts a partial cross-sectional view of the semiconductor topography, wherein the dielectric is etched from upon the upper surface of the gate conductor and the pad oxide layer is etched from the substrate surface, subsequent to the step in FIG. 11.

Turning to FIG. 11, source/drain dopants may then be implanted at a relatively high dose and energy into regions of substrate 10 not masked by oxide layer 32 and gate conductor 26 to form source and drain regions 30 laterally adjacent the sidewalls of the trench in which gate conductor 26 partially resides. If a PMOS integrated circuit is being fabricated, p-type dopant species are implanted, and if an NMOS integrated circuit is being formed, n-type dopant species are implanted. Some commonly used n-type species are arsenic or phosphorus, and some commonly used p-type species are boron or boron difluoride. Oxide layer 12 may serve to distribute the dopant species passing therethrough to substrate 10. The resulting transistor comprising source and drain regions 30 and gate conductor 26 includes a channel within substrate 10 between LDD areas 28. The effective depth of source and drain regions 30 is relatively shallow as opposed to the actual depth of the source and drain regions. FIG. 12 illustrates the removal of oxide layer 32 from the upper surface of gate conductor 26 and pad oxide layer 12 from the upper surface of substrate 10 using an anisotropic etch step. Oxide layer 32 is thus only retained upon the upper portions of the opposed sidewall surfaces of gate conductor 26. A post-implant anneal may be performed to activate and position the as-implanted impurities.

Figure 13:
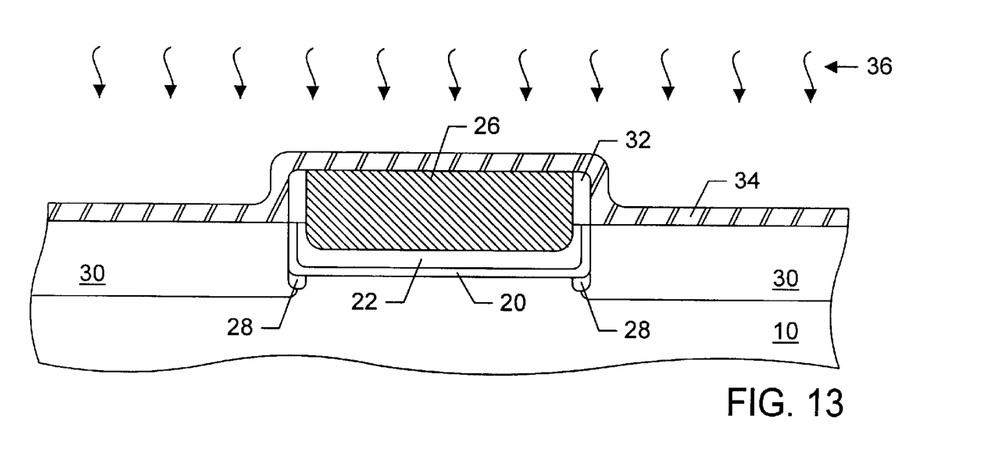
FIG. 13 depicts a partial cross-sectional view of the semiconductor topography, wherein a refractory metal is deposited across the topological surface and subjected to a thermal cycle, subsequent to the step in FIG. 12.
Figure 14:
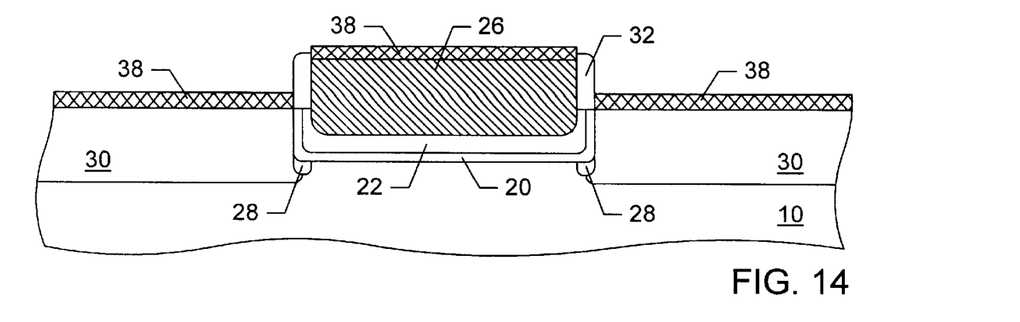
FIG. 14 depicts a partial cross-sectional view of the semiconductor topography, wherein metal silicide is formed upon the source and drain regions and the upper surface of the gate conductor as a result of the process shown in FIG. 13.

FIGS. 13–14 illustrate the formation of silicide structures 38 (e.g., $TiSi_2$ or $CoSi_2$) upon the upper surfaces of gate conductor 26 and source and drain regions 30. As shown in FIG. 13, a refractory metal 34, e.g., titanium or cobalt, is deposited across the semiconductor topography using either sputter deposition from a metal target or metal organic chemical vapor deposition ("MOCVD") from a gas comprising a metal organic-containing compound. Dielectric structures 32 are strategically placed laterally adjacent the sidewall surfaces of gate conductor 26 to inhibit refractory metal 34 form contacting the gate conductor. Metal 34 is then exposed to a form of radiation 36 provided by either an annealing furnace or an RTA chamber. As a result of being subjected to a heat cycle, metal 34 reacts with underlying silicon of substrate 10 and polysilicon gate conductor 26 to form metal silicide structures 38. Unreacted portions of refractory metal 34 are then removed using an etch technique which is highly selective to the metal, as shown in FIG. 14.

Figure 15:
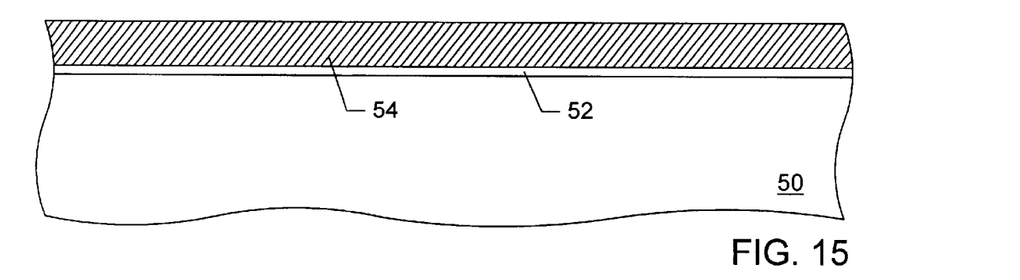
FIG. 15 depicts a partial cross-sectional view of a semiconductor topography according to another embodiment of the present invention, wherein a nitride layer and a pad oxide layer are formed across a silicon-based substrate to create a masking layer.

FIGS. 15–26 illustrate a sequence of semiconductor fabrication steps according to one embodiment of the present invention. Turning to FIG. 15, a partial cross-sectional view of a semiconductor substrate 50 is depicted. Substrate 50 preferably comprises single crystalline silicon which has been slightly doped with n-type or p-type impurities. A pad oxide layer 52 is formed across semiconductor substrate 50 using, e.g., LPCVD from a TEOS source. A nitride layer 54 is then CVD deposited across pad oxide layer 12 from, e.g., a silane- and ammonia-bearing source. Pad oxide layer 52 serves to reduce the inherent stresses which normally exist between nitride and silicon. Nitride layer 54 in combination with pad oxide layer 52 functions as a masking layer during a subsequent ion implantation step.

Figure 16:
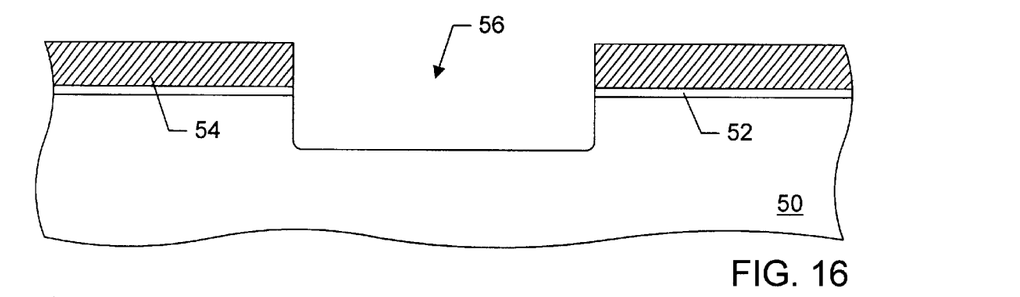
FIG. 16 depicts a partial cross-sectional view of the semiconductor topography, wherein portions of the nitride layer, the oxide layer, and the substrate are etched away to form a trench extending below the uppermost surface of the substrate, subsequent to the step in FIG. 15.
Figure 17:
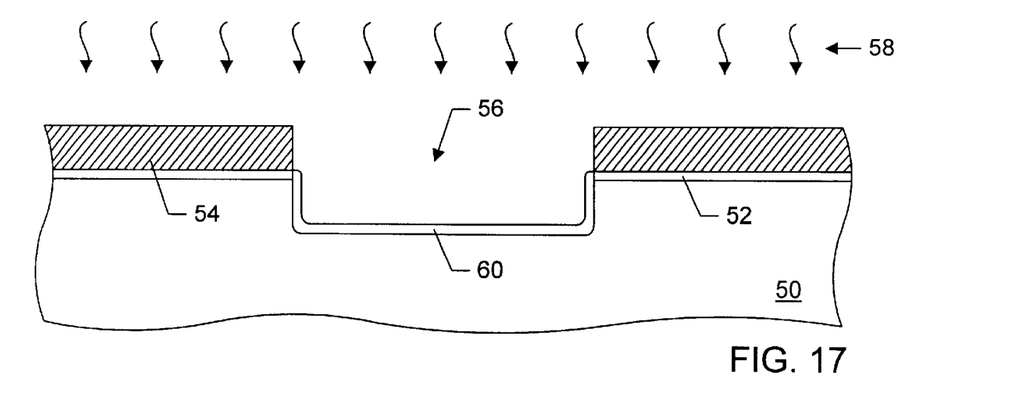
FIG. 17 depicts a partial cross-sectional view of the semiconductor topography, wherein a gate dielectric is thermally grown upon the silicon-based surfaces bordering the trench, subsequent to the step in FIG. 16.

As shown in FIG. 16, portions of nitride layer 54, pad oxide layer 52, and substrate 50 are then etched to form a trench 56 within substrate 50. Lithography is used to pattern a photoresist mask across nitride layer 54 exclusive of the region to be etched. The etch technique is preferably a dry, plasma etch in which the etch duration is selected to terminate after a pre-defined thickness of the substrate has been removed. The depth of trench 56 relative to the horizontal uppermost surface of substrate 50 may be, e.g., 0.1 to 0.5 micron. Opposed sidewalls of trench 56 are aligned with opposed lateral boundaries of nitride layer 54. FIG. 17 illustrates a gate dielectric 60 being formed upon the silicon-based. surfaces arranged at the periphery of trench 56. Those silicon-based surfaces may be oxidized by subjecting substrate 60 to thermal radiation 58 while placing substrate 50 in an oxygen-bearing ambient. While gate dielectric 60 is preferably a thermally grown oxide, it may also be other dielectric materials. Nitride layer 54 substantially inhibits ambient oxygen from penetrating to and oxidizing underlying regions of substrate 10. As such, nitride layer 54 may be substituted with any material which can inhibit oxygen from passing to the underlying substrate surface.

Figure 18:
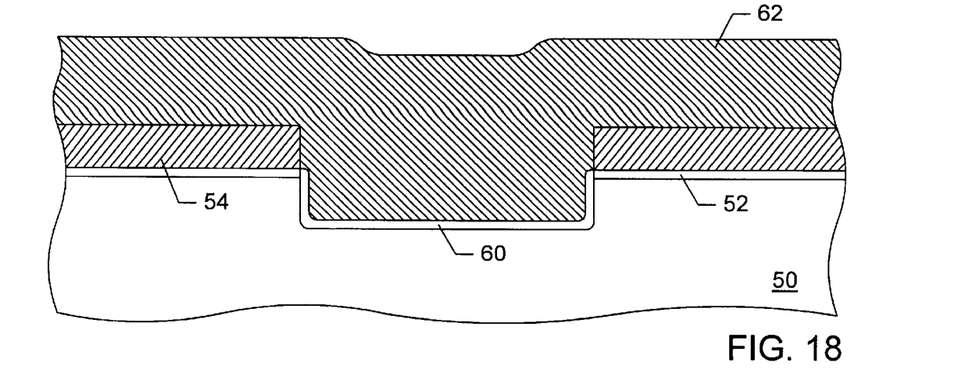
FIG. 18 depicts a partial cross-sectional view of the semiconductor topography, wherein a gate conductor material is deposited across exposed surfaces of the gate dielectric and the masking layer to a level spaced above the upper surface of the masking layer, subsequent to the step in FIG. 17.
Figure 19:
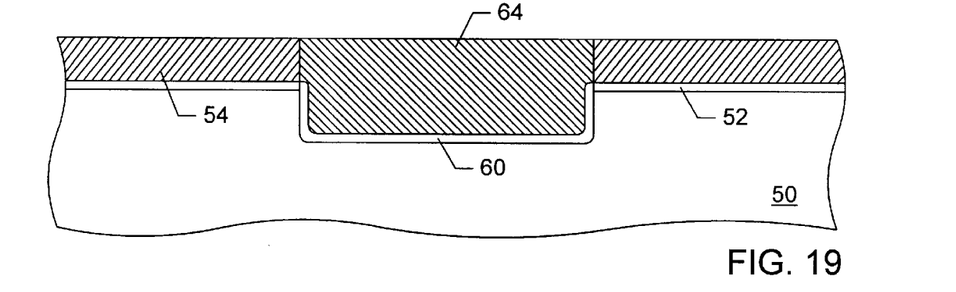
FIG. 19 depicts a partial cross-sectional view of the semiconductor topography, wherein the gate conductor material is removed down to a level approximately commensurate with the upper surface of the masking layer, subsequent to the step in FIG. 18.
Figure 20:
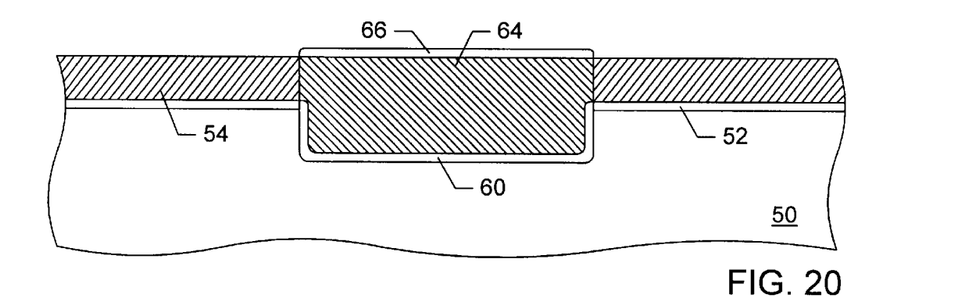
FIG. 20 depicts a partial cross-sectional view of the semiconductor topography, wherein an oxide layer is thermally grown upon the exposed upper surface of the gate conductor, subsequent to the step in FIG. 19.
Figure 21:
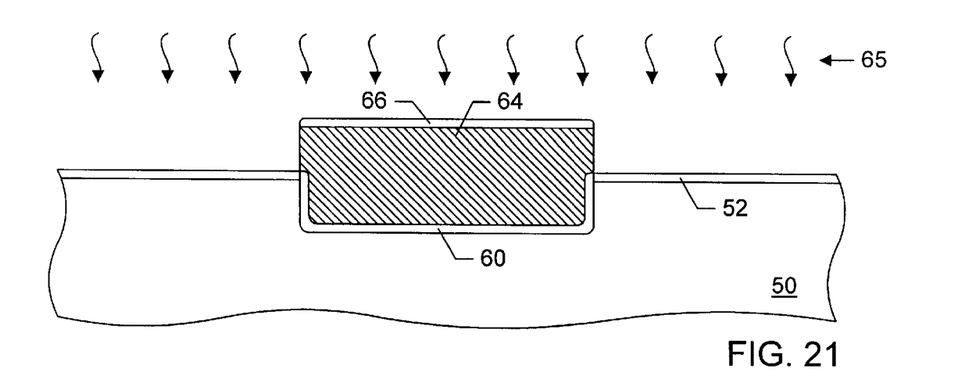
FIG. 21 depicts a partial cross-sectional view of the semiconductor topography, wherein the nitride layer is removed from the pad oxide layer, subsequent to the step in FIG. 20.

Turning to FIG. 18, a gate conductor material 62 is then deposited to a level spaced above the upper surface of nitride layer 54. Thereafter, as shown in FIG. 19, gate conductor material 62 may be subjected to CMP or sacrificial etchback to make the upper surface of gate conductor material 62 substantially coplanar with the upper surface of nitride layer 54. As a result of this process step, a gate conductor 64 is formed between the opposed lateral boundaries of nitride layer 54 and partially recessed below the uppermost surface of substrate 50. FIG. 20 depicts the formation of an oxide layer 66 across the exposed upper surface of gate conductor 64. Oxide layer 66 may be thermally grown upon the gate conductor surface by exposing gate conductor 64 to thermal radiation 65 while submersing the gate conductor in an oxygen-bearing ambient. As shown in FIG. 21, nitride layer 54 may then be removed from pad oxide layer 52 using a plasma etch or a wet etch chemistry, thereby exposing the opposed sidewall surfaces of gate conductor 64.

Figure 22:
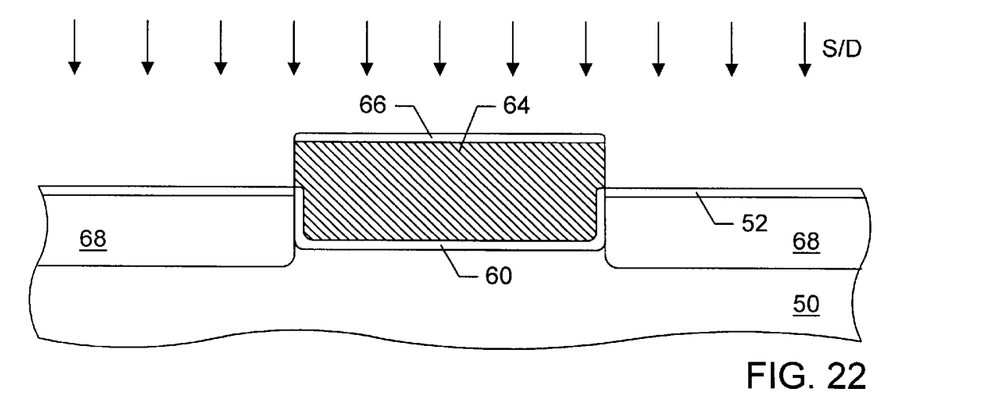
FIG. 22 depicts a partial cross-sectional view of the semiconductor topography, wherein a source/drain implant that is self-aligned to the opposed sidewall surfaces of the gate conductor is forwarded into the substrate, subsequent to the step in FIG. 21.
Figure 23:
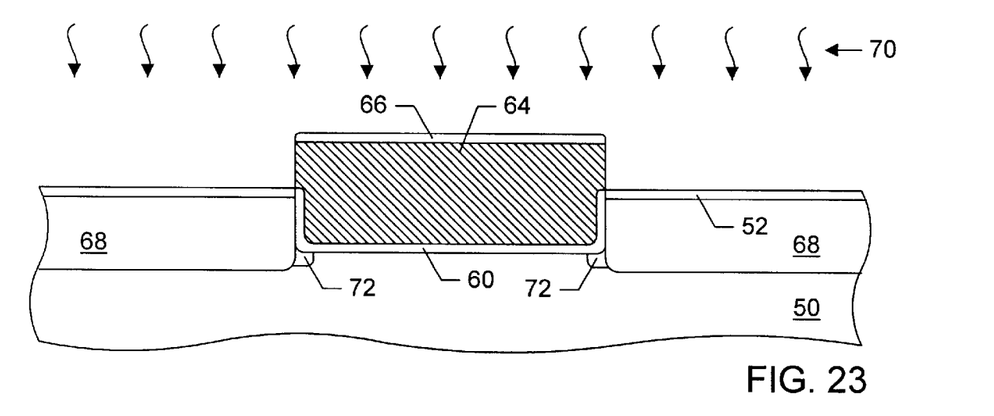
FIG. 23 depicts a partial cross-sectional view of the semiconductor topography, wherein the substrate is heated to cause lateral migration of the dopant species positioned within the source and drain regions, and thereby form LDD areas underneath the edges of the trench, subsequent to the step in FIG. 22.

FIG. 22 illustrates a source/drain implant which is self-aligned to the opposed sidewall surfaces of gate conductor 64 being forwarded into substrate 50. In this manner, source and drain regions 68 having a relatively high concentration of dopant are formed which extend from above the base of gate conductor 64 to below the base of gate conductor 64. Source and drain regions 68 have a relatively shallow effective depth interposed between a channel region of substrate 50 underneath the trench in which gate conductor 64 is partially formed. A post-implant anneal may be performed to activate and position the as-implanted impurities. As shown in FIG. 23, substrate 50 may then be heated using, e.g., an RTA anneal, to cause the lateral migration of dopant species therein. As a result of the anneal step, LDD areas 72 are formed beneath gate dielectric 60 laterally adjacent source and drain regions 68. Since an RTA anneal lasts for a relatively short period of time, the dopant species do not migrate far. As such, the lateral width of each LDD area 72 may be reduced to lower the resistance to current flow between the source and drain.

Figure 24:
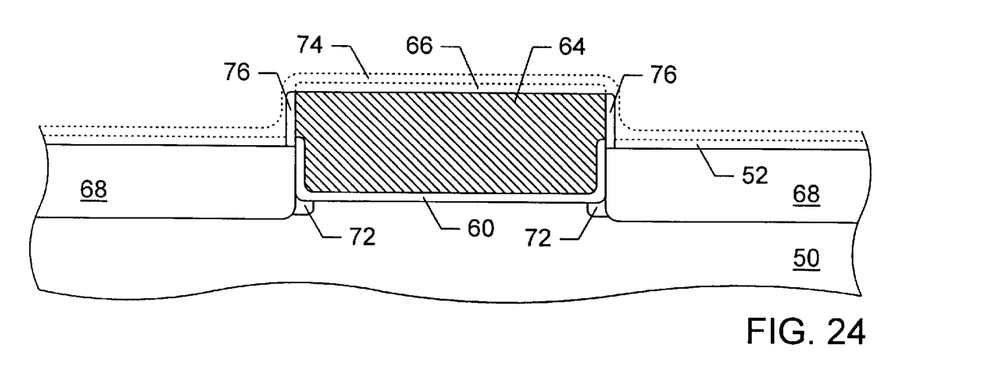
FIG. 24 depicts a partial cross-sectional view of the semiconductor topography, wherein dielectric sidewall spacers are formed upon exposed upper portions of the opposed sidewall surfaces of the gate conductor, the oxide layer is removed from the upper surface of the gate conductor, and the pad oxide layer is removed from the substrate, subsequent to the step in FIG. 23.

FIG. 24 depicts the formation of dielectric sidewall spacers 76 upon upper portions of the opposed sidewall surfaces of gate conductor 64. Sidewall spacers 76 are formed by depositing a dielectric across the semiconductor topography, followed by anisotropically etching the dielectric. The deposition time of the dielectric may be reduced without being concerned that the dielectric deposited across the upper portions of the opposed sidewall surfaces of gate conductor 64 will be non-conformal since those upper portions are relatively short in height. The duration of the anisotropic etch is preferably chosen to terminate after a portion 74 of the spacer dielectric, oxide layer 66, and pad oxide layer 52 have been removed from underlying surfaces. The spacer dielectric retained upon the opposed sidewall surfaces of gate conductor 64 form sidewall spacers 76 having a lateral thickness of approximately 0.03 to 0.05 micron. Spacers 76 may, e.g., comprises oxide, nitride, or silicon oxynitride.

Figure 25:
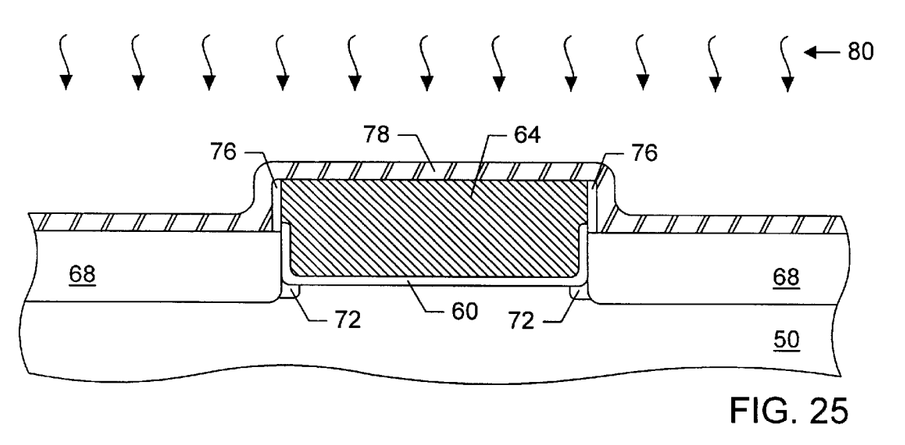
FIG. 25 depicts a partial cross-sectional view of the semiconductor topography, wherein a refractory metal is deposited across the topological surface and subjected to a thermal cycle to initiate reaction between silicon in the substrate and the gate conductor with the metal, subsequent to the step in FIG. 24.
Figure 26:
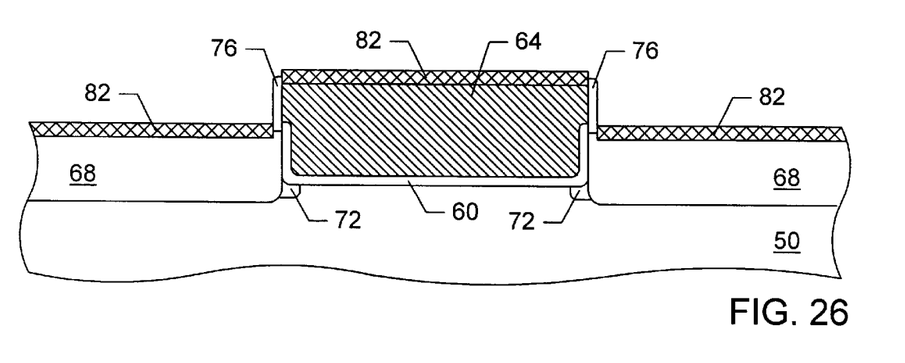
FIG. 26 depicts a partial cross-sectional view of the semiconductor topography, wherein metal silicide is formed upon the source and drain regions and the upper surface of the gate conductor as a result of the process shown in FIG. 25, and wherein the unreacted refractory metal is removed.

FIGS. 25–26 illustrate the formation of silicide structures 82 (e.g., $TiSi_2$ or $CoSi_2$) upon the upper surfaces of gate conductor 64 and source and drain regions 68. As shown in FIG. 25, a refractory metal 78, e.g., titanium or cobalt, is deposited across the semiconductor topography using either sputter deposition from a metal target or MOCVD deposition from a gas comprising a metal organic-containing compound. Dielectric sidewall spacers 76 are strategically placed laterally adjacent the sidewall surfaces of gate conductor 64 to inhibit refractory metal 78 form contacting the gate conductor. Metal 78 is then exposed to a form of radiation 80 supplied from either an annealing furnace or an RTA chamber. As a result of being subjected to a heat cycle, metal 78 reacts with underlying silicon of substrate 50 and polysilicon gate conductor 64 to form metal silicide structures 82. As shown in FIG. 26, unreacted portions of refractory metal 78 are then removed using an etch technique which is highly selective to the metal.

It will be appreciated to those skilled in the art having the benefit of this disclosure that this invention is believed to provide a method for forming relatively thin sidewall spacers extending laterally from upper portions of opposed sidewall surfaces of a transistor gate conductor which resides partially within a trench of a semiconductor substrate. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming an integrated circuit, comprising:
   forming a gate dielectric upon sidewalls and a base of a trench formed within a semiconductor substrate, wherein a masking layer is formed upon an upper surface of the substrate exterior to the trench;
   depositing a dielectric layer across the masking layer and the gate dielectric such that dielectric sidewall spacers are formed upon opposed lateral boundaries of the masking layer; and
   forming a gate conductor upon the dielectric layer interposed between the dielectric sidewall spacers.

2. The method of claim 1, further comprising selectively etching the dielectric sidewall spacers to a level approximately commensurate with the upper surface of the substrate, thereby at least partially exposing the opposed lateral boundaries of the masking layer and opposed sidewall surfaces of the gate conductor.

3. The method of claim 2, further comprising implanting a first dopant distribution into the substrate between the opposed lateral boundaries of the masking layer and the opposed sidewall surfaces of the gate conductor, thereby forming a pair of LDD areas a lateral spaced distance apart underneath the base of the trench.

4. The method of claim 3, wherein the gate conductor comprises polysilicon, and further comprising thermally growing a silicon dioxide layer upon an uppermost surface of the gate conductor and exposed portions of the opposed sidewall surfaces of the gate conductor, thereby forming oxide spacer structures interposed between the opposed lateral boundaries of the masking layer and the opposed sidewall surfaces of the gate conductor.

5. The method of claim 4, wherein said thermally growing a silicon dioxide layer comprises rapid thermal annealing the gate conductor while exposing the gate conductor to an oxygen-bearing ambient.

6. The method of claim 4, further comprising:
   removing the masking layer, thereby exposing lateral surfaces of the oxide spacer structures; and
   implanting a second dopant distribution into the substrate self-aligned to the exposed lateral surfaces of the oxide spacer structures, thereby forming a pair of source/drain regions within the substrate laterally adjacent the LDD areas.

7. The method of claim 6, further comprising:
   anisotropically etching the silicon dioxide layer from an uppermost surface of the gate conductor concurrent with etching a lower portion of the masking layer from the upper surface of the substrate; and
   forming silicide structures upon the uppermost surface of the gate conductor and the pair of source/drain regions.

8. The method of claim 7, wherein the masking layer comprises silicon nitride, and wherein a layer of silicon dioxide is interposed between the masking layer and the upper surface of the substrate.

9. The method of claim 8, wherein the semiconductor substrate comprises single crystalline silicon.

10. The method of claim 9, wherein said forming a gate dielectric comprises thermally growing silicon dioxide upon the sidewalls and the base of the trench, wherein the masking layer substantially inhibits the silicon dioxide from growing upon the upper surface of the substrate underneath the masking layer.

11. The method of claim 1, wherein said forming a gate conductor comprises:

depositing polysilicon across the masking layer and the dielectric layer to a level spaced above the masking layer; and
chemical-mechanical polishing the polysilicon and the dielectric layer to a level approximately commensurate with a top surface of the masking layer.

12. A method for forming an integrated circuit, comprising:
   forming a gate dielectric upon opposed sidewalls and a base of a trench formed within a semiconductor substrate, wherein a masking layer is formed upon an upper surface of the substrate exterior to the trench;
   forming a gate conductor upon the gate dielectric interposed between opposed lateral boundaries of the masking layer;
   thermally growing a silicon dioxide layer across an uppermost surface of the gate conductor;
   removing the masking layer to expose upper portions of opposed sidewall surfaces of the gate conductor;
   implanting a dopant distribution which is self-aligned to the opposed sidewall surfaces of the gate conductor into the substrate to form a pair of source/drain regions laterally adjacent the opposed sidewalls of the trench subsequent to said removing the masking layer;
   rapid thermal annealing the substrate to cause the dopant distribution to migrate laterally underneath the trench, thereby forming a pair of lightly doped drain areas within the substrate laterally adjacent the source/drain regions prior to said forming dielectric sidewall spacers; and
   forming dielectric sidewall spacers extending laterally from the upper portions of the opposed sidewall surfaces of the gate conductor.

13. The method of claim 12, wherein the masking layer comprises silicon nitride, and wherein a pad oxide layer is formed between the substrate and the masking layer.

14. The method of claim 13, further comprising forming silicide structures upon the uppermost surface of the gate conductor and the source/drain regions subsequent to said forming dielectric sidewall spacers.

15. The method of claim 12, wherein the substrate comprises single crystalline silicon, and wherein said forming a gate dielectric comprises thermally growing silicon dioxide upon the opposed sidewalls and the base of the trench.

16. The method of claim 12, wherein said forming a gate conductor comprises:
   depositing polysilicon across the masking layer and the gate dielectric to a level spaced above the masking layer; and
   chemical-mechanical polishing the polysilicon to a level approximately commensurate with a top surface of the masking layer.

17. The method of claim 13, wherein said forming dielectric sidewall spacers comprises:
   chemically-vapor depositing a dielectric layer across the pad oxide layer, the upper portions of the opposed sidewall surfaces of the gate conductor, and the silicon dioxide layer; and
   anisotropically etching the dielectric layer from the pad oxide layer and the silicon dioxide layer.

18. The method of claim 17, further comprising etching the pad oxide layer from the substrate and the silicon dioxide layer from the uppermost surface of the gate conductor concurrent with said anisotropically etching the dielectric layer.

* * * * *